(12) United States Patent
Kerber et al.

(10) Patent No.: US 10,204,837 B2
(45) Date of Patent: *Feb. 12, 2019

(54) STRUCTURE AND METHOD FOR TENSILE AND COMPRESSIVE STRAINED SILICON GERMANIUM WITH SAME GERMANIUM CONCENTRATION BY SINGLE EPITAXY STEP

(71) Applicant: International Business Machines Corporation, Armonk, NY (US)

(72) Inventors: Pranita Kerber, Mount Kisco, NY (US); Qiqing C. Ouyang, Yorktown Heights, NY (US); Alexander Reznicek, Troy, NY (US); Dominic J. Schepis, Wappingers Falls, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/951,722

(22) Filed: Apr. 12, 2018

(65) Prior Publication Data

US 2018/0233418 A1    Aug. 16, 2018

Related U.S. Application Data

(63) Continuation of application No. 15/474,071, filed on Mar. 30, 2017, which is a continuation of application
(Continued)

(51) Int. Cl.
*H01L 21/84* (2006.01)
*H01L 27/12* (2006.01)
(Continued)

(52) U.S. Cl.
CPC .... *H01L 21/845* (2013.01); *H01L 21/823807* (2013.01); *H01L 21/823821* (2013.01);
(Continued)

(58) Field of Classification Search
CPC ........... H01L 21/0245; H01L 21/02532; H01L 21/02381
See application file for complete search history.

(56) References Cited

U.S. PATENT DOCUMENTS 8,889,504 B2 * 11/2014 Dyer ............... H01L 21/823807
257/368
9,209,301 B1 * 12/2015 Nguyen ............ H01L 21/76251
(Continued)

OTHER PUBLICATIONS

List of IBM Patents or Patent Applications Treated as Related—Date Filed: Apr. 13, 2018; 2 pages.

*Primary Examiner* — Angel Roman
(74) *Attorney, Agent, or Firm* — Cantor Colburn LLP; Steven Meyers

(57) ABSTRACT

A method of making a semiconductor device includes forming a first silicon germanium layer on a substrate, the first silicon germanium layer forming a portion of a first transistor; forming a second silicon germanium layer on the substrate adjacent to the first silicon germanium layer, the second silicon germanium layer forming a portion of a second transistor and having a germanium content that is different than the first silicon germanium layer and a thickness that is substantially the same; growing by an epitaxial process a compressively strained silicon germanium layer on the first silicon germanium layer, and a tensile strained silicon germanium layer on the second silicon germanium layer; patterning a first fin in the compressively strained silicon germanium layer and the first silicon germanium layer; and patterning a second fin in the tensile strained
(Continued)

silicon germanium layer and the second silicon germanium layer.

20 Claims, 8 Drawing Sheets

Related U.S. Application Data

No. 15/201,929, filed on Jul. 5, 2016, now Pat. No. 9,647,119, which is a continuation of application No. 14/967,526, filed on Dec. 14, 2015, now Pat. No. 9,443,873.

(51) Int. Cl.
*H01L 29/78* (2006.01)
*H01L 29/10* (2006.01)
*H01L 21/8238* (2006.01)
*H01L 27/092* (2006.01)
*H01L 21/02* (2006.01)
*H01L 29/161* (2006.01)

(52) U.S. Cl.
CPC ........ *H01L 27/092* (2013.01); *H01L 27/1211* (2013.01); *H01L 29/1054* (2013.01); *H01L 29/7849* (2013.01); *H01L 21/0245* (2013.01); *H01L 21/02381* (2013.01); *H01L 21/02488* (2013.01); *H01L 21/02502* (2013.01); *H01L 21/02532* (2013.01); *H01L 27/0924* (2013.01); *H01L 29/161* (2013.01)

(56) References Cited

U.S. PATENT DOCUMENTS

| | | | |
|---|---|---|---|
| 9,443,873 B1 | 9/2016 | Kerber et al. | |
| 9,647,119 B1 | 5/2017 | Kerber et al. | |
| 2004/0026765 A1* | 2/2004 | Currie | H01L 21/823807 257/616 |
| 2010/0244107 A1* | 9/2010 | Kronholz | H01L 21/02381 257/288 |
| 2015/0099334 A1* | 4/2015 | Liu | H01L 21/823807 438/199 |
| 2015/0145002 A1* | 5/2015 | Lee | H01L 27/0922 257/192 |
| 2017/0207136 A1 | 7/2017 | Kerber et al. | |

* cited by examiner

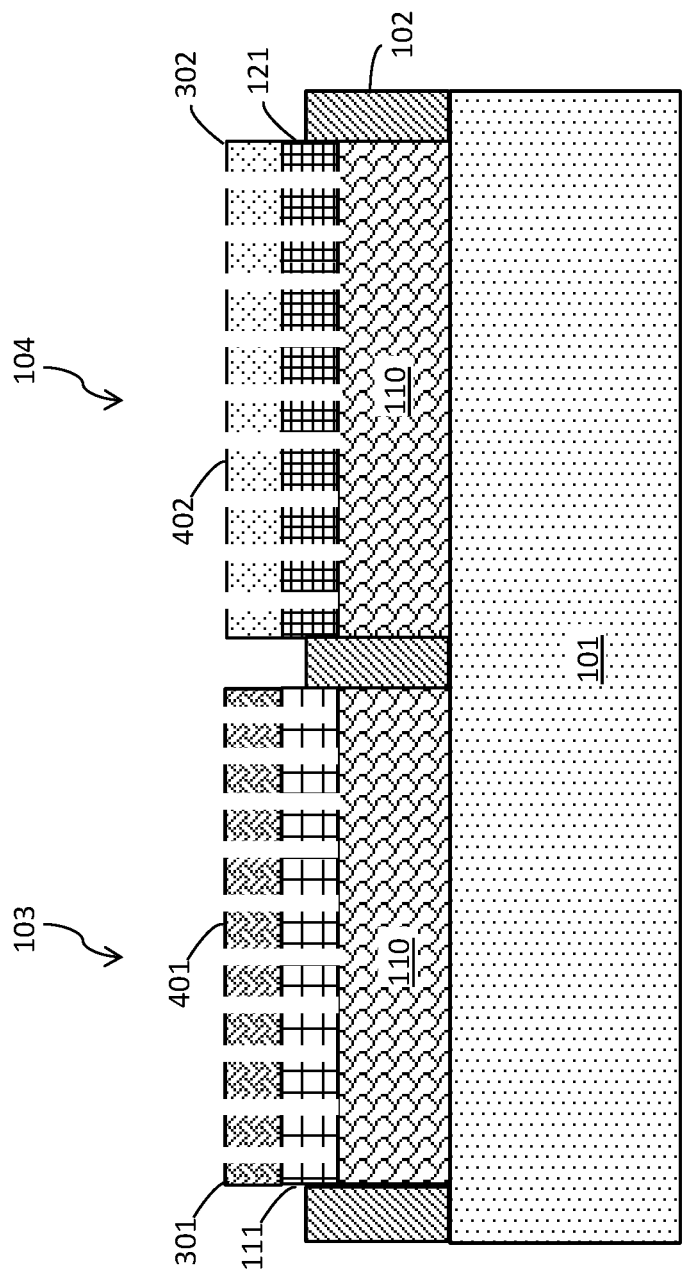

STRUCTURE AND METHOD FOR TENSILE AND COMPRESSIVE STRAINED SILICON GERMANIUM WITH SAME GERMANIUM CONCENTRATION BY SINGLE EPITAXY STEP

DOMESTIC PRIORITY

This application is a continuation of and claims priority from U.S. patent application Ser. No. 15/474,071, filed on Mar. 30, 2017, which is a continuation of and claims priority from U.S. patent application Ser. No. 15/201,929, filed on Jul. 5, 2016, now U.S. Pat. No. 9,647,119, which is a continuation of and claims priority from U.S. patent application Ser. No. 14/967,526, filed on Dec. 14, 2015, now U.S. Pat. No. 9,443,873, each application is incorporated herein by reference in its entirety.

BACKGROUND

The present invention relates to complementary metal oxide semiconductor (CMOS), and more specifically, to silicon germanium (SiGe) material layers.

CMOS is used for constructing integrated circuits. CMOS technology is used in microprocessors, microcontrollers, static random access memory (RAM), and other digital logic circuits. CMOS designs may use complementary and symmetrical pairs of p-type and n-type metal oxide semiconductor field effect transistors (MOSFETs) for logic functions.

The MOSFET is a transistor used for switching electronic signals. The MOSFET has a source, a drain, and a metal oxide gate electrode. The metal gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

N-type field effect transistors (nFET) and p-type field effect transistors (pFET) are two types of complementary MOSFETs. The nFET uses electrons as the current carriers and with n-doped source and drain junctions. The pFET uses holes as the current carriers and with p-doped source and drain junctions.

SUMMARY

According to an embodiment, a method of making a semiconductor device includes forming a first silicon germanium layer on a substrate, the first silicon germanium layer forming a portion of a first transistor; forming a second silicon germanium layer on the substrate adjacent to the first silicon germanium layer, the second silicon germanium layer forming a portion of a second transistor and having a germanium content that is different than the first silicon germanium layer of the first transistor, and the first silicon germanium layer and the second silicon germanium layer having substantially the same thickness; growing by an epitaxial process a compressively strained silicon germanium layer on the first silicon germanium layer, and a tensile strained silicon germanium layer on the second silicon germanium layer; patterning a first fin in the compressively strained silicon germanium layer and the first silicon germanium layer of the first transistor; and patterning a second fin in the tensile strained silicon germanium layer and the second silicon germanium layer of the second transistor.

According to another embodiment, a semiconductor device includes a substrate comprising a semiconductor material; a buried dielectric layer arranged on the substrate; a first transistor comprising a fin arranged on the buried dielectric layer, the fin having a silicon germanium layer arranged on the buried dielectric layer and a compressively strained silicon germanium layer arranged on the silicon germanium layer; a second transistor comprising a fin arranged on the buried dielectric layer, the fin having a silicon germanium layer arranged on the buried dielectric layer and a tensile strained silicon germanium layer arranged on the silicon germanium layer; and a gate positioned on the fin of the first transistor and the fin of the second transistor; wherein the compressively strained strained silicon germanium layer and the tensile strained silicon germanium layer have a germanium content that is substantially the same.

Yet, according to another embodiment, a semiconductor device includes a substrate comprising a semiconductor material; a buried dielectric layer arranged on the substrate; a first transistor comprising a fin arranged on the buried dielectric layer, the fin having a first relaxed silicon germanium layer arranged on the buried dielectric layer and a compressively strained silicon germanium layer arranged on the silicon germanium layer; a second transistor comprising a fin arranged on the buried dielectric layer, the fin having a second relaxed silicon germanium layer arranged on the buried dielectric layer and a tensile strained silicon germanium layer arranged on the silicon germanium layer, the second relaxed silicon germanium layer comprising a germanium content that is greater than the first relaxed silicon germanium layer; and a gate arranged on the fin of the first transistor and the fin of the second transistor.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

FIGS. 1-5 illustrate exemplary methods of making semiconductor devices according to various embodiments, in which:

FIG. 1 is a cross-sectional side view of a first SiGe layer on a first transistor and a second SiGe layer on a second transistor;

FIG. 2 is a cross-sectional side view after growing SiGe layers having the same germanium content on the first and second SiGe layers;

FIG. 3A is a cross-sectional side view after patterning fins in the semiconductor stacks;

FIG. 5 is a cross-sectional side view after depositing a gate stack on the fins.

DETAILED DESCRIPTION

As CMOS nodes scale to smaller dimensions, device performance targets may present a challenge. For 10 nm and 7 nm FinFET devices, silicon germanium (SiGe) fins may be used to increase pFET performance. However, CMOS devices with dual channel materials, for example, SiGe fins and silicon (Si) fins, are more challenging to fabricate than devices with a single channel material. CMOS devices that include the same channel material for pFET and nFET fins are often less complex to integrate.

Accordingly, various embodiments provide methods of making semiconductor devices with both tensile and compressively strained SiGe with the same germanium content in a single process step. The tensile and compressively strained SiGe regions may be used in nFET and pFET devices, respectively, to form a CMOS structure having a single channel material.

Figure 1:
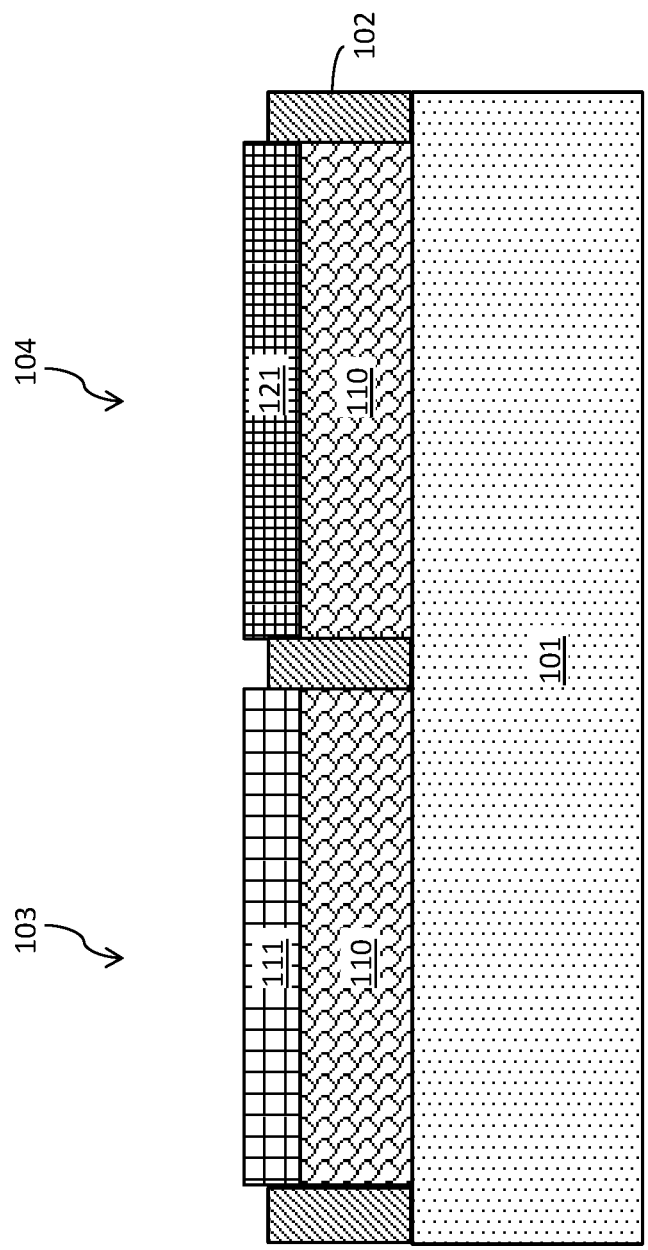

Turning now to the Figures, FIGS. 1-5 illustrate exemplary methods of making semiconductor devices according to various embodiments. FIG. 1 is a cross-sectional side view of a first transistor 103 and a second transistor 104 arranged on a substrate 101. The substrate 101 may include one or more semiconductor materials. The substrate 101 provides a support or handle substrate platform. Non-limiting examples of substrate 101 materials include Si (silicon), strained Si, SiC (silicon carbide), Ge (germanium), SiGe (silicon germanium alloy), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride), or any combination thereof. The substrate 101 may include a single layer or multiple layers.

The crystal orientation of the substrate 101 may be, for example, {100}, {110}, or {111}. Although other crystallographic orientations may be used. The substrate 101 may be a single crystalline semiconductor material, a polycrystalline material, or an amorphous material.

A first SiGe layer 111 is formed on the substrate 101 in the first transistor 103 area, and a second SiGe layer 121 is formed on the substrate 101 in the second transistor area 104. The first SiGe layer 111 and the second SiGe layer 121 have different germanium contents and have a substantially uniform thickness. The first SiGe layer 111 and the second SiGe layer 121 are relaxed (no strain). In some embodiments, the first SiGe layer 111 and the second SiGe layer 121 are 90 to 100% relaxed. The first SiGe layer 111 and the second SiGe layer 121 may be formed according to any methods.

The first SiGe layer 111 and the second SiGe layer 121 are arranged on buried dielectric layers 110 between isolation regions 102. The buried dielectric layer 110 may be, for example, a crystalline or non-crystalline oxide or nitride. In one embodiment, the buried dielectric layer 110 is an oxide such as, for example, silicon dioxide. Other non-limiting examples of materials for the buried dielectric layer 110 layer include an oxide, e.g., silicon oxide, a nitride, e.g., silicon nitride, oxynitrides of silicon, e.g., silicon oxynitride, or a combination thereof. The insulator layer forming the buried oxide layer 110 may be formed by various methods, including but not limited to, ion implantation methods, thermal or plasma oxidation or nitridation methods, chemical vapor deposition (CVD) methods, and physical vapor deposition (PVD) methods. The buried dielectric layer 110 may have a thickness of 300 nm or less. In another embodiment, the buried dielectric layer 110 may have a thickness ranging from 2 nm to 150 nm. In yet another embodiment, the buried dielectric layer 110 may have a thickness ranging from 5 nm to 30 nm.

In an exemplary embodiment, one method of forming the structure shown in FIG. 1 includes starting with a silicon-on-insulator (SOI) substrate. Active regions of the first transistor 103 and the second transistor 104 are separated by shallow trench isolation (STI), and then the first SiGe layer 111 and the second SiGe layer 121 are formed out of the silicon layer on top of the buried oxide layer in the SOI.

The germanium content in the first SiGe layer 111 and the second SiGe layer 121 may generally vary. In some embodiments, the first SiGe layer 111 includes a germanium content in a range from about 10 to about 40 at. %, and the second SiGe layer 121 includes a germanium content in a range from about 30 to about 80 at. %. In one exemplary embodiment, first SiGe layer 111 includes about 25 at. % germanium, and second SiGe layer 121 includes about 75 at. % germanium. In other embodiments, the first SiGe layer 111 includes a germanium content in a range from about 10 to about 30 at. %, and the second SiGe layer 121 includes a germanium content in a range from about 30 to about 80 at. %. Yet, in other embodiments, the first SiGe layer 111 and the second SiGe layer 121 have a difference of germanium content of at least 30 at. %. Still yet, in other embodiments, the first SiGe layer 111 has a lower germanium content than the second SiGe layer 121, which may be at least 30 at. % lower.

The thicknesses of the first SiGe layer 111 and the second SiGe layer 121 generally vary. In some embodiments, the first SiGe layer 111 has a thickness in a range from about 6 to about 1000 nm, and the second SiGe layer 121 includes has a thickness in a range from about 6 to about 1000 nm. Although, first SiGe layer 111 and second SiGe layer 121 are not limited to these thicknesses, as they may have any thicknesses provided they are substantially the same.

Figure 2:
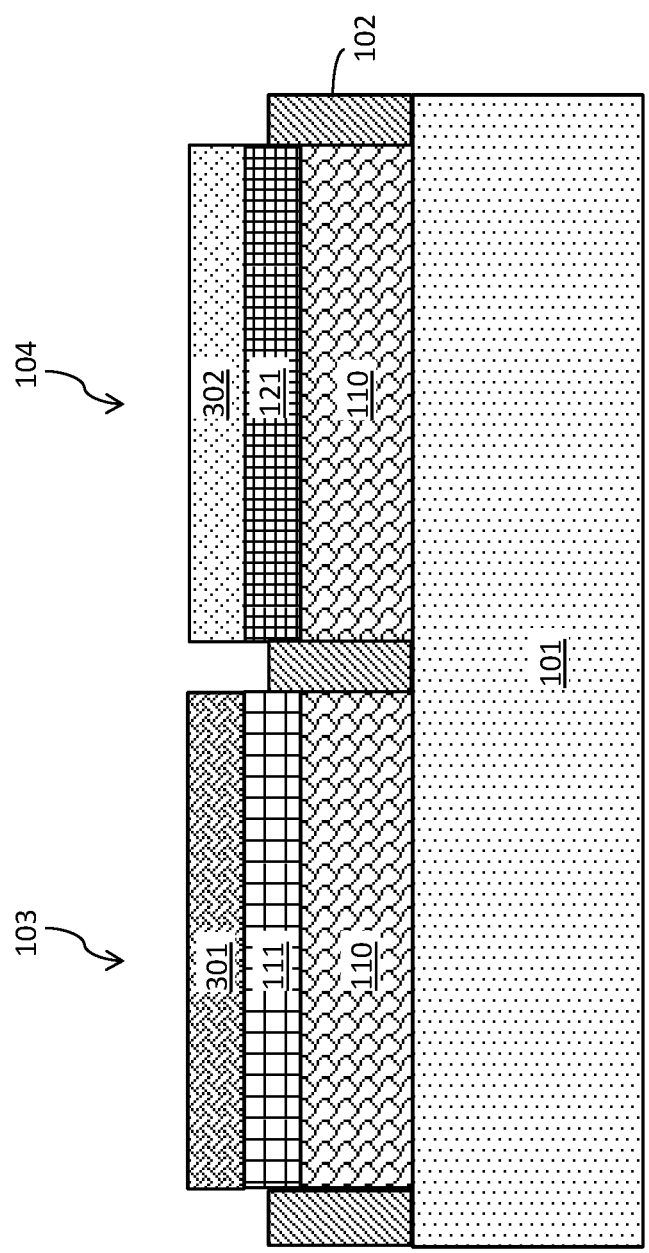

FIG. 2 is a cross-sectional side view after growing by an epitaxial process a third SiGe layer 301 on the first SiGe layer 111 and a fourth SiGe layer 302 on the second SiGe layer 121. The third SiGe layer 302 and the fourth SiGe layer 302 have the same or substantially the same germanium content. The germanium content of the third SiGe layer 301 and the fourth SiGe layer 302 may be, for example, in a range from about 30 to about 70%. The germanium content of the third SiGe layer 301 and the fourth SiGe layer 302 is between the first SiGe layer 111 and the second SiGe layer 121. In an exemplary embodiment, the third SiGe layer 301 and the fourth SiGe layer 302 include 50 at. % germanium. In other embodiments, the germanium content of the third SiGe layer 301 and the fourth SiGe layer 302 is in a range from about 30 to about 70 at. %.

The germanium content of the third SiGe layer 301 and the fourth SiGe layer 302 is in a range that is between the germanium content of the first SiGe layer 111 and the second SiGe layer 121. For example, when the first SiGe layer 111 includes 25 at. % germanium, and the second SiGe layer 121 includes 75 at. % germanium, the third SiGe layer 301 and the fourth SiGe layer 302 will include a germanium content in a range from 25 at. % and 75 at. %. Using a germanium content in this range results in making both tensile and compressively strained SiGe with the same germanium content in a single epitaxial growth step.

Epitaxially growing the third SiGe layer 301 to include, for example, a germanium content of about 50 at. %, when the germanium content of the first SiGe layer 111 is about 25 at. %, results in the third SiGe layer 301 being compressively strained. Likewise, epitaxially growing the fourth SiGe layer 302 to include a germanium content of about 50 at. %, when the germanium content of the second SiGe layer 121 is about 75 at. % results in the fourth SiGe layer 302 being tensile strained. The type of strain, whether compressive or tensile, may be suitable for different types of transistors. Compressive strained layers may be used in pFETs (for example, first transistor 103, and tensile strained layers may be used in nFETs (for example, second transistor 104). The degree of strain depends on the difference in germanium content between the first SiGe layer 111 and the third SiGe layer 301, and between the second SiGe layer 121 and the fourth SiGe layer 302. In an exemplary embodiment, when the third SiGe layer 301 includes 50 at. % germanium, and the first SiGe layer 111 includes 25 at. % germanium, the third SiGe layer 301 has about 1% compressive strain. When the fourth SiGe layer 301 includes 50 at. % germanium, and the second SiGe layer 121 includes 75 at. % germanium, the fourth SiGe layer 302 has about 1% tensile strain.

As mentioned above, the degree of tensile and compressive strain depends on the difference in germanium content successive layers, or more particularly, between the first SiGe layer 111 and the third SiGe layer 301, and between the second SiGe layer 121 and the fourth SiGe layer 302. The % strain can be measured using high resolution x-ray diffractometry to determine the lattice constants from which the strain can be calculated.

In some embodiments, the first SiGe layer 111 has a germanium content that is less than the germanium content of the compressively strained third SiGe layer 301, and the second SiGe layer 121 has a germanium content that is greater than the germanium content of the tensile strained fourth SiGe layer 302. In other embodiments, the germanium content of the tensile strained fourth SiGe layer 302 and the compressively strained third SiGe layer 301 is less than the germanium content of the second SiGe layer 121 and greater than the germanium content of the first SiGe layer 111.

In some embodiments, the third SiGe layer 111 has at least 1% compressive strain. In other embodiments, the third SiGe layer 301 has about 0.5 to about 2% compressive strain. Yet, in other embodiments, the fourth SiGe layer 302 has at least 1% compressive strain. Still yet, in other embodiments, the fourth SiGe layer has about 0.5 to about 2% compressive strain.

To ensure that the third SiGe layer 301 and the fourth SiGe layer 302 are strained, the thickness of each of the layers is grown to a thickness than is less than the critical thickness, or the thickness at which the strained layer relaxes. In some embodiments, the thickness of the third SiGe layer 301 and the fourth SiGe layer 302 is in a range from about 10 to about 50 nm.

Figure 3B:
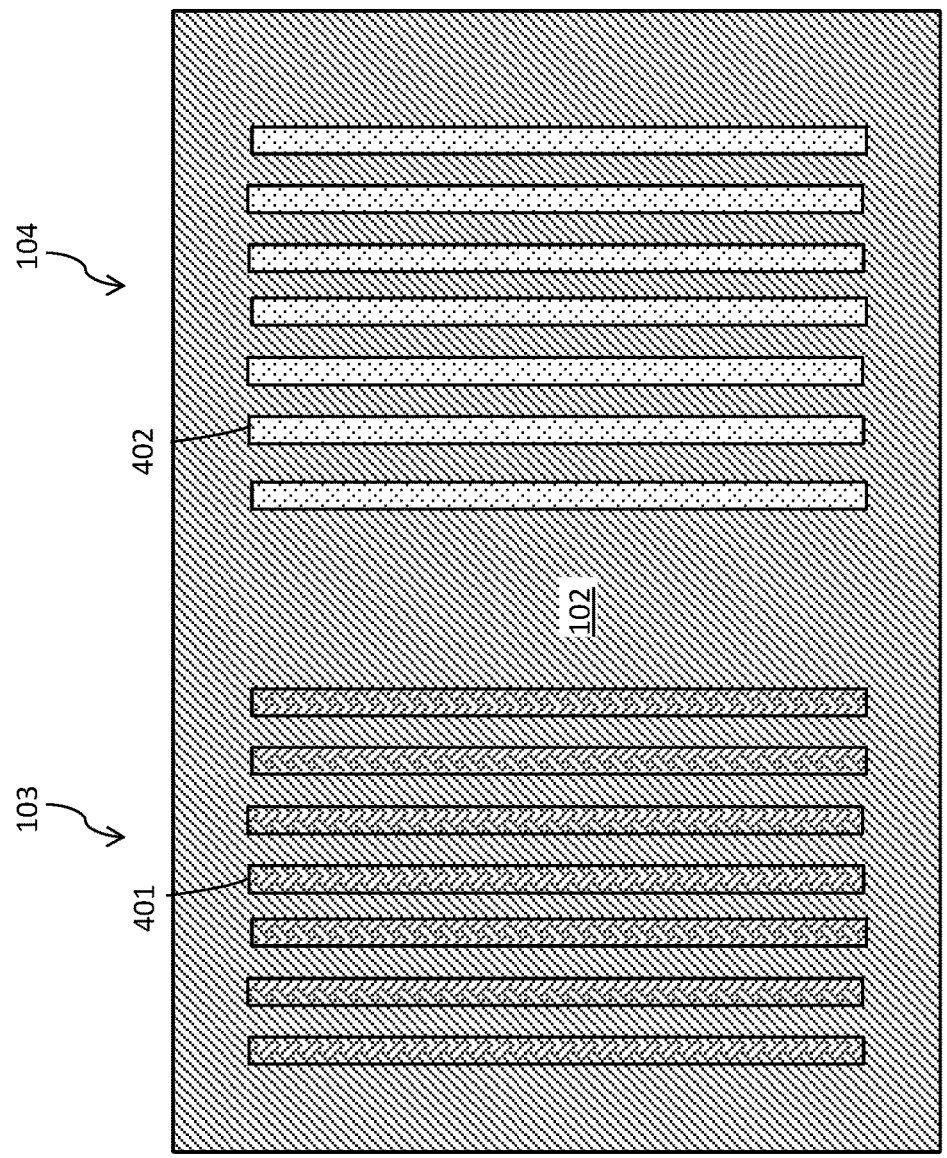
FIG. 3B is a top view of FIG. 3A.

FIG. 3A is a cross-sectional side view after patterning fins in the third SiGe layer 301 and the fourth SiGe layer 302. FIG. 3B is a top view of FIG. 3A. The fins 401 of the first transistor 103 are patterned through the third SiGe layer 301 and the first SiGe layer 111, stopping on the buried dielectric layer 110. The fins 402 of the second transistor are patterned through the fourth SiGe layer 302 and the second SiGe layer 121, stopping on the buried dielectric layer 110. The fin formation patterning does not affect the strain state of the active fin regions, defined by the third SiGe layer 301 and the fourth SiGe layer 302. The fins 401 and fins 402 may be patterned by, for example, sidewall imaging transfer (SIT).

Figure 4A:
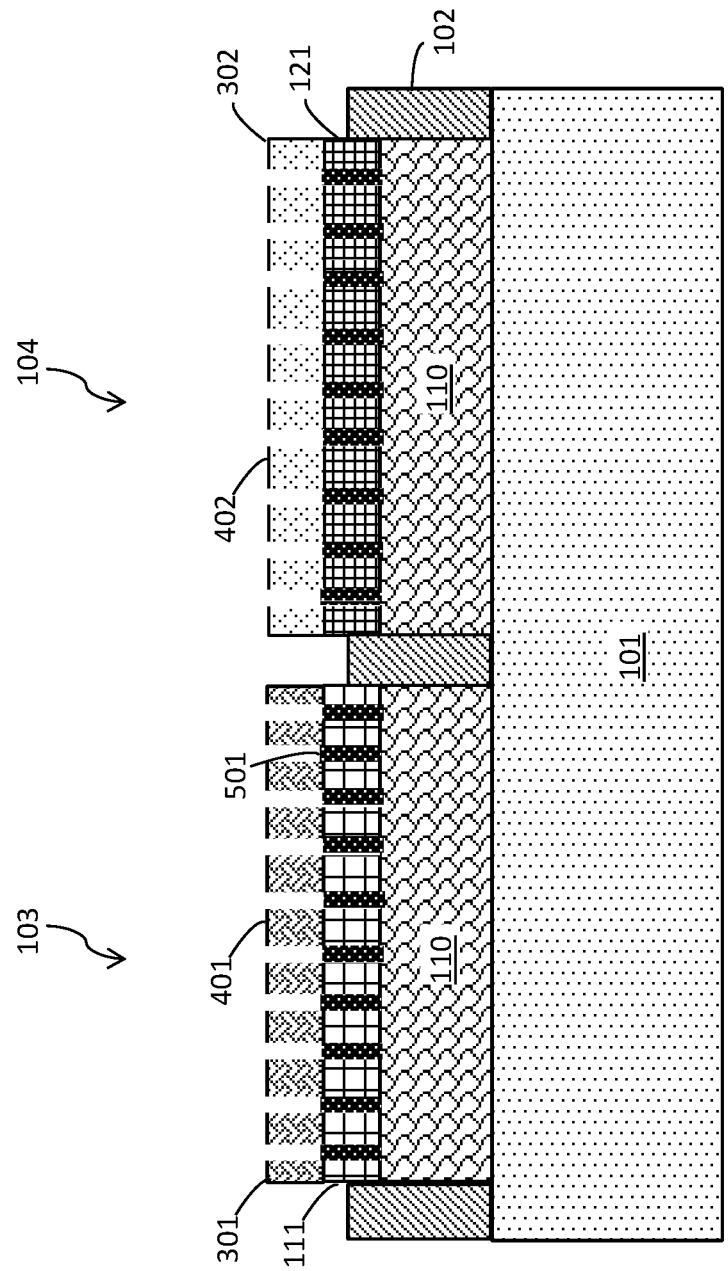
FIG. 4A is a cross-sectional side view after depositing a dielectric material between the fins.
Figure 4B:
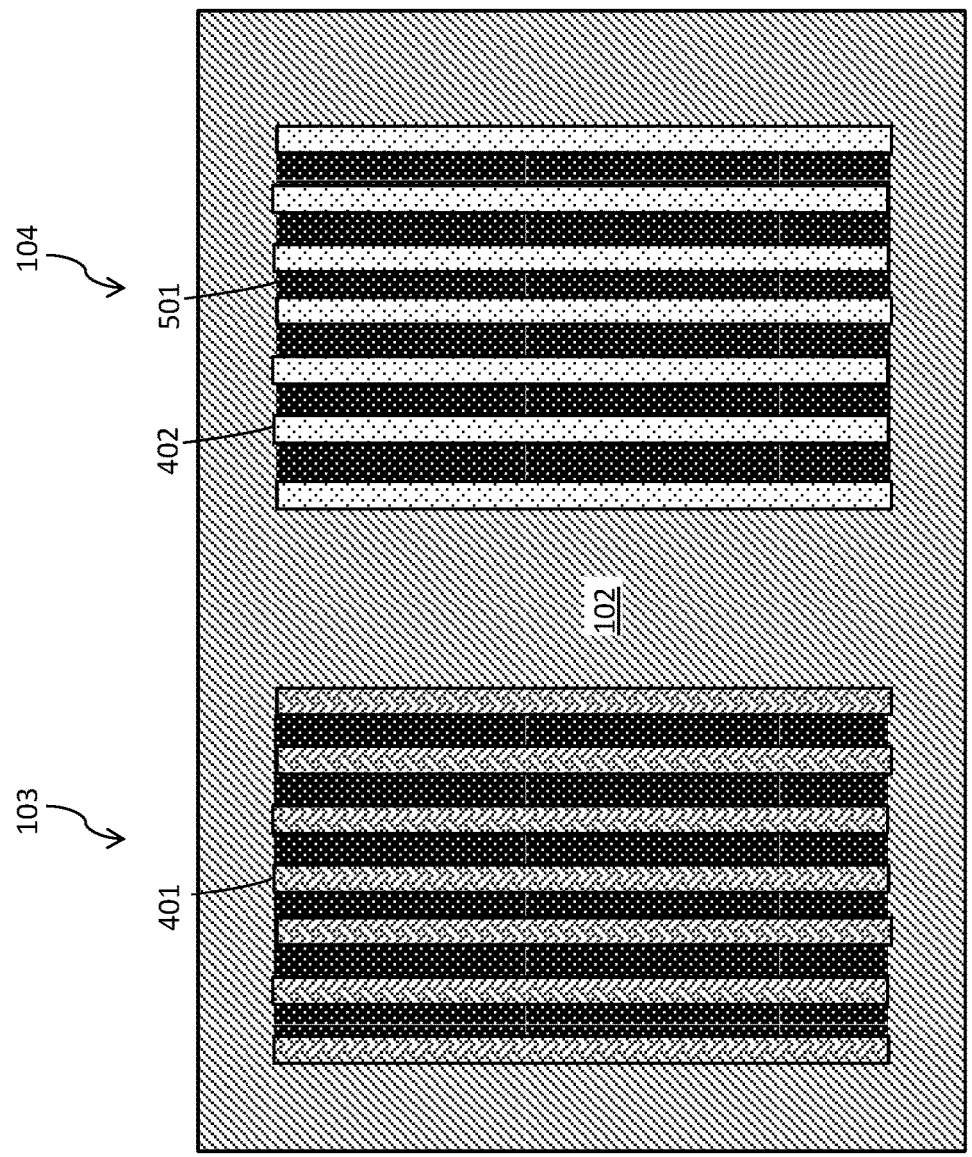
FIG. 4B is a top view of FIG. 4A.

FIG. 4A is a cross-sectional side view after depositing a dielectric material 501 between the fins 401 of the first transistor 103 and between the fins 402 of the second transistor 104. FIG. 4B is a top view of FIG. 5A.

Non-limiting examples of materials for the dielectric material 501 include dielectric oxides (e.g., silicon oxide), dielectric nitrides (e.g., silicon nitride), dielectric oxynitrides, or any combination thereof. The dielectric material 501 may be deposited by a deposition process, for example, chemical vapor deposition (CVD) or physical vapor deposition (PVD). After depositing the dielectric material 501, a dry etch process, for example, ME, may be used to etch the dielectric material 501 down to a level below the third SiGe layer 301 and the fourth SiGe layer 302.

Figure 5:
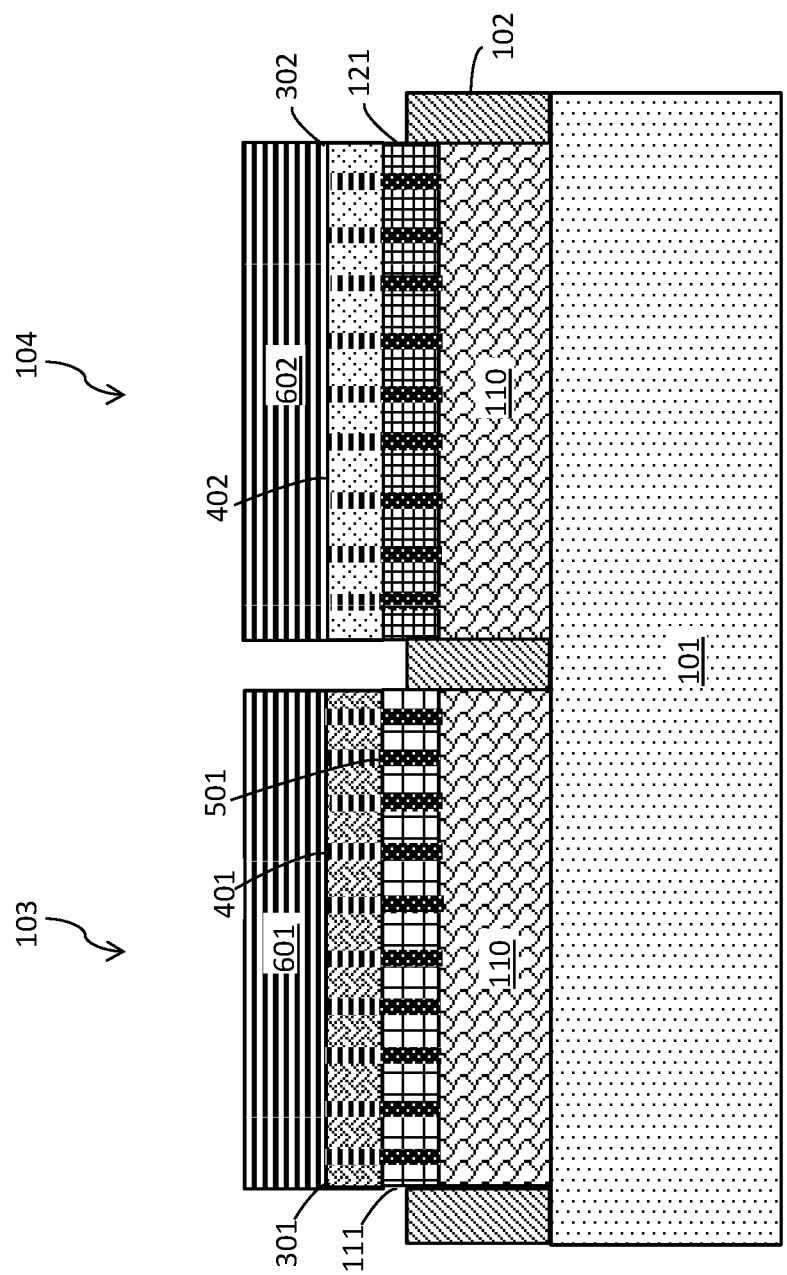

FIG. 5 is a cross-sectional side view after depositing a gate stack 601 on the fins 401 and a gate stack 602 on the fins 402. The materials and thickness may differ between the compressively strained third SiGe layer 301 and the tensile strained fourth SiGe layer 302.

The gate stack 601 and gate stack 602 may include gates formed by depositing one or more dielectric materials, one or more workfunction metals, and one or more metal gate conductor materials. The gate dielectric material(s) can be a dielectric material having a dielectric constant greater than 3.9, 7.0, or 10.0. Non-limiting examples of suitable materials for the dielectric material include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The gate dielectric material layer may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the dielectric material may vary depending on the deposition process as well as the composition and number of high-k dielectric materials used.

The work function metal(s) may be disposed over the gate dielectric material. The type of work function metal(s) depends on the type of transistor. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) may be deposited by a suitable deposition process, for example, CVD, PECVD, PVD, plating, thermal or e-beam evaporation, and sputtering.

A conductive metal is deposited over the dielectric material(s) and workfunction layer(s) to form the gate stacks. Non-limiting examples of suitable conductive metals include aluminum (Al), platinum (Pt), gold (Au), tungsten (W), titanium (Ti), or any combination thereof. The conductive metal may be deposited by a suitable deposition process, for example, CVD, PECVD, PVD, plating, thermal or e-beam evaporation, and sputtering. A planarization process, for example, chemical mechanical planarization (CMP), is performed to polish the surface of the conductive gate metal.

Figure 6:
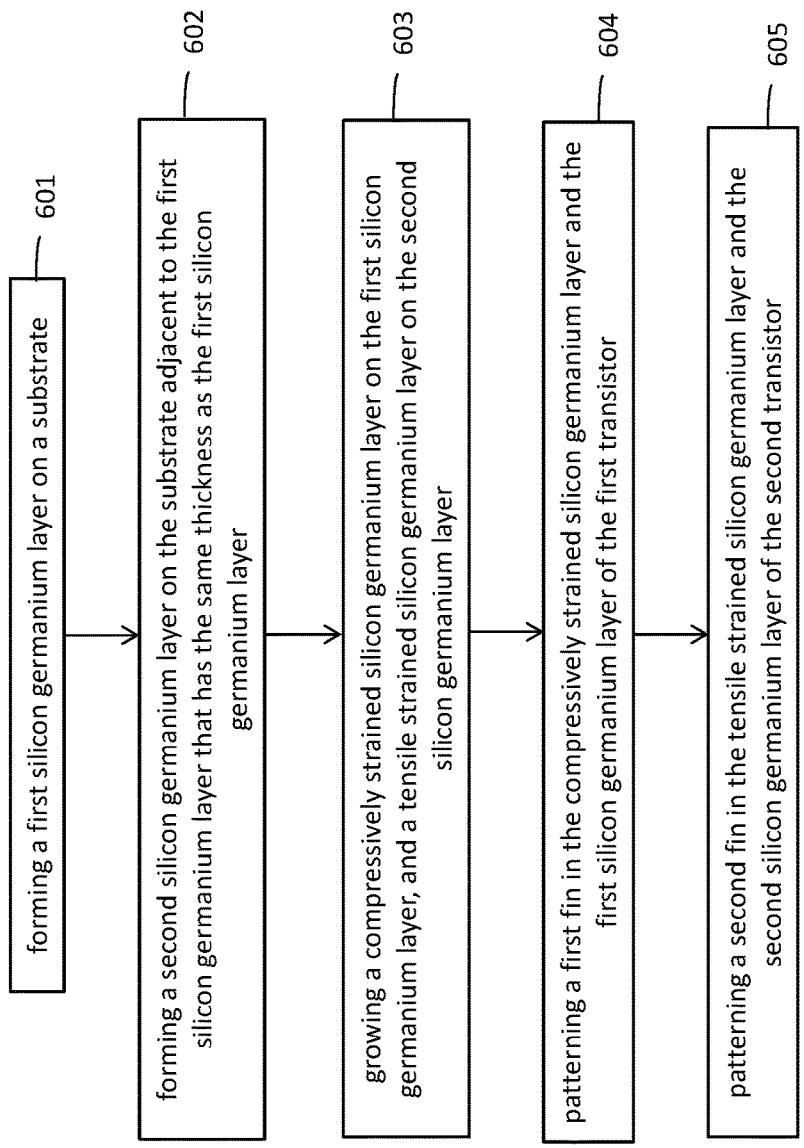
FIG. 6 is a flow diagram illustrating a method of making a semiconductor device according to an embodiment.

FIG. 6 is a flow diagram illustrating a method of making a semiconductor device according to an embodiment. In box 601, the method includes forming a first silicon germanium layer on a substrate. The first silicon germanium layer forms a portion of a first transistor. In box 602, a second silicon germanium layer is formed on the substrate adjacent to the first silicon germanium layer. The second silicon germanium layer forms a portion of a second transistor and has a germanium content that is different than the first silicon germanium layer of the first transistor. The first silicon germanium layer and the second silicon germanium layer have substantially the same thickness. In box 603, a compressively strained silicon germanium layer is grown by an epitaxial growth process on the first silicon germanium layer, and a tensile strained silicon germanium layer is grown on the second silicon germanium layer. In box 604, a first fin is patterned in the compressively strained silicon germanium layer and the first silicon germanium layer of the first transistor. In box 605, a second fin is patterned in the tensile strained silicon germanium layer and the second silicon germanium layer of the second transistor.

As described above, various embodiments provide methods of making semiconductor devices with both tensile and compressively strained SiGe with the same germanium content in a single epitaxial growth process step. The tensile and compressively strained SiGe regions may be used in nFET and pFET devices, respectively, to forma a CMOS structure having a single channel material.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device, comprising:
a first transistor comprising a fin arranged on a substrate, the fin having a first relaxed silicon germanium layer arranged on the substrate; and
a second transistor adjacent to the first transistor and comprising a fin arranged on the substrate, the fin of the second transistor having a second relaxed silicon germanium layer arranged on the substrate and a tensile strained silicon germanium layer arranged on the second relaxed silicon germanium layer, the second relaxed silicon germanium layer comprising a germanium content that is different than the first relaxed silicon germanium layer.

2. The semiconductor device of claim 1, wherein the first transistor is a pFET.

3. The semiconductor device of claim 2, wherein the second transistor is an nFET.

4. The semiconductor device of claim 1, wherein a germanium content of the tensile strained silicon germanium layer is less than a germanium content of the second relaxed silicon germanium layer.

5. The semiconductor device of claim 4, further comprising a compressively strained layer arranged on the first relaxed silicon germanium layer.

6. The semiconductor device of claim 4, wherein the germanium content of the tensile strained silicon germanium layer is greater than a germanium content of the first relaxed silicon germanium layer.

7. The semiconductor device of claim 5, wherein the germanium content of the compressively strained silicon germanium layer is greater than a germanium content of the first relaxed silicon germanium layer.

8. The semiconductor device of claim 5, wherein the compressively strained silicon germanium layer and the tensile strained silicon germanium layer have a germanium content that is substantially the same.

9. The semiconductor device of claim 5, wherein a thickness of the compressively strained silicon germanium layer is in a range from about 10 to about 50 nm.

10. The semiconductor device of claim 1, wherein a thickness of the first relaxed silicon germanium layer of the first transistor is in a range from about 6 to about 1000 nm.

11. The semiconductor device of claim 1, wherein a thickness of the second relaxed silicon germanium layer of the second transistor is in a range from about 6 to about 1000 nm.

12. The semiconductor device of claim 1, wherein a thickness of the the tensile strained silicon germanium layer is in a range from about 10 to about 50 nm.

13. A semiconductor device, comprising:
a first fin arranged on a substrate, the first fin comprising a silicon germanium layer; and
a second fin arranged on the substrate, the second fin comprising a relaxed silicon germanium layer and a tensile strained silicon germanium layer arranged on the relaxed silicon germanium layer, the relaxed silicon germanium layer comprising a germanium content that is different than the silicon germanium layer.

14. The semiconductor device of claim 13, wherein the first fin is a portion of a pFET.

15. The semiconductor device of claim 13, wherein the second second fin is a portion of an nFET.

16. The semiconductor device of claim 13, wherein a germanium content of the tensile strained silicon germanium layer is less than a germanium content of the relaxed silicon germanium layer.

17. The semiconductor device of claim 16, further comprising a compressively strained silicon germanium layer arranged on the silicon germanium layer, and the compressively strained silicon germanium layer comprising a germanium content that is less than the relaxed silicon germanium layer.

18. The semiconductor device of claim 16, wherein the germanium content of the tensile strained silicon germanium layer is greater than a germanium content of the silicon germanium layer.

19. The semiconductor device of claim 17, wherein the germanium content of the compressively strained silicon germanium layer is greater than a germanium content of the silicon germanium layer.

20. The semiconductor device of claim 13, wherein a thickness of the silicon germanium layer of the first transistor is in a range from about 6 to about 1000 nm.

* * * * *